US007693500B2

(12) United States Patent
van der Meulen

(10) Patent No.: US 7,693,500 B2
(45) Date of Patent: Apr. 6, 2010

(54) PANORAMIC DISPLAY FOR A WIRELESS DEVICE

(75) Inventor: Pieter S. van der Meulen, Los Altos, CA (US)

(73) Assignee: Palm, Inc., Sunnyvale, CA (US)

( * ) Notice: Subject to any disclaimer, the term of this patent is extended or adjusted under 35 U.S.C. 154(b) by 930 days.

(21) Appl. No.: 11/447,534

(22) Filed: Jun. 5, 2006

(65) Prior Publication Data

US 2007/0291052 A1 Dec. 20, 2007

(51) Int. Cl.
*H03J 7/32* (2006.01)

(52) U.S. Cl. ......................... 455/145; 455/73; 455/130; 455/550.1; 455/566

(58) Field of Classification Search ................. 345/156, 345/168, 169, 204, 660, 698; 455/145, 550.1, 455/566; 340/7.55; 715/800
See application file for complete search history.

(56) References Cited

U.S. PATENT DOCUMENTS

| | | | | |
|---|---|---|---|---|
| 6,831,662 | B1 | 12/2004 | Lum et al. | |
| 7,149,549 | B1 * | 12/2006 | Ortiz et al. | 455/566 |
| 2004/0212731 | A1 | 10/2004 | Sie et al. | |
| 2005/0259144 | A1 | 11/2005 | Eshkoli | |
| 2006/0114246 | A1 * | 6/2006 | Young | 345/204 |

FOREIGN PATENT DOCUMENTS

| | | | |
|---|---|---|---|
| WO | 2007143612 | A2 | 12/2007 |

* cited by examiner

*Primary Examiner*—My-Chau T Tran
(74) *Attorney, Agent, or Firm*—Kacvinsky LLC

(57) ABSTRACT

Various embodiments of a panoramic display for a wireless device are described. In one embodiment, a wireless device may include a display comprising a plurality of display regions. The display regions may include a central display region and multiple lateral display regions arranged to provide a panoramic display. Image compression and/or scaling may be applied to media content that is to be displayed in one or more of the lateral display regions based on the proximity of the lateral display region to the edge of the display.

19 Claims, 4 Drawing Sheets

PANORAMIC DISPLAY FOR A WIRELESS DEVICE

BACKGROUND

A wireless device such as a handheld computer and/or mobile telephone may incorporate features such as a color display screen, a digital camera, Web access, and multimedia capability. The display screen for a wireless device may be implemented, for example, by a liquid crystal display (LCD) containing a matrix of pixels and employing a back light to project light through the matrix.

The resolution or aspect ratio of a display screen generally refers to the number of pixels that can be displayed, typically expressed as a product of the number of columns and the number or rows. In many cases, a wireless device may include a square display screen having an aspect ratio of 1:1 with a resolution of 320×320 or 480×480, for example. Most media sources, however, have a non-square aspect ratio such as 4:3, 3:2, 16:9, or even 2:1. For example, the aspect ratio for standard television as well as for many web sites and multimedia products is 4:3. High-definition television (HDTV) and many digital video cameras use an aspect ratio of 16:9. Digital video disc (DVD) players may be designed to use an aspect ratio of either 4:3 or 16:9.

Conventional best fit algorithms such as those defined by the Synchronized Multimedia Integration Language (SMIL) specification may be suitable for fitting content to non-square displays, but produce a black bar on square displays. Consequently, there may be a need for improved display systems and techniques for a wireless device.

DETAILED DESCRIPTION

Various embodiments may be directed to systems and techniques that may potentially improve the performance of a wireless device to display content from a media source. In one embodiment, for example, a wireless device may include a display comprising a plurality of display regions. The plurality of display regions may extend horizontally between the edges of the display, and each of the display regions may be defined by a number of pixels in a horizontal direction. The display regions may comprise a central display region and multiple lateral display regions arranged to provide a panoramic display.

In various implementations, image compression and/or scaling may be applied to media content having an aspect ratio and/or resolution that is different from the aspect ratio and/or resolution of the display. Image compression may be applied, for example, to media content having an aspect ratio of 3:2 with a resolution of 480×320 that is to be displayed by a display having an aspect ratio of 1:1 with a resolution of 320×320. The image compression may be applied progressively to the media content that is to be displayed in one or more of the lateral display regions based on the proximity of the lateral display region to the edge of the display. For example, more image compression may be applied to the media content which is to be displayed at or near the edges of the display than to the media content which is to be displayed at or near the central region. In such implementations, a wireless device having a square or substantially square display may be arranged to emulate a non-square display and to better match the aspect ratio of typical video content without cropping. Accordingly, a user may realize enhanced products and services.

Figure 1:
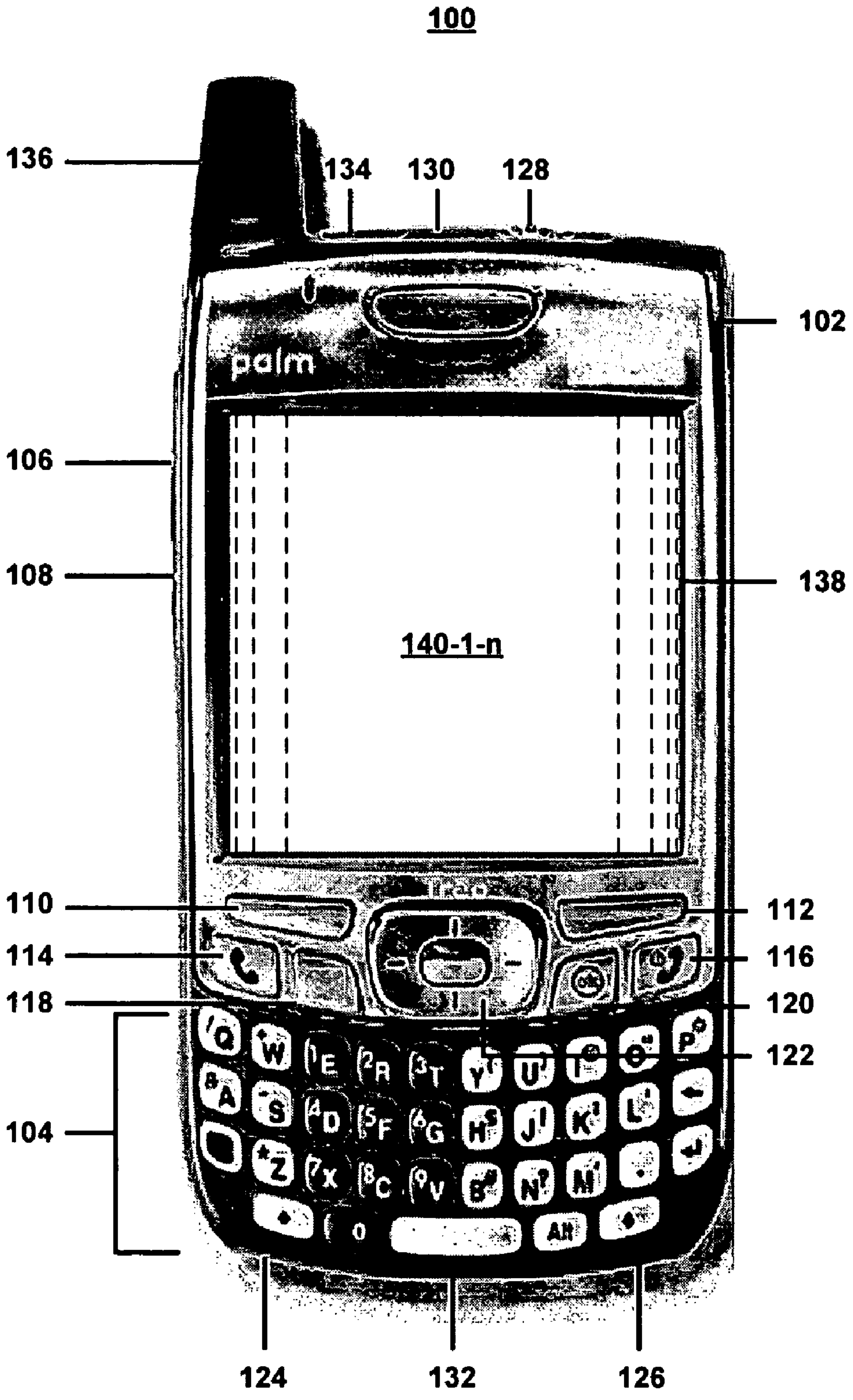
FIG. 1 illustrates one embodiment of a wireless device.

FIG. 1 illustrates one embodiment of a wireless device 100. As shown, the wireless device 100 may be implemented as a combination handheld computer and mobile telephone or smartphone. Examples of smartphones include, for example, Palm® products such as Palm® Treo™ smartphones. Although some embodiments may be described with the wireless device 100 implemented as a smartphone by way of example, it may be appreciated that the embodiments are not limited in this context. For example, the wireless device 100 may comprise, or be implemented as, a handheld computer, mobile telephone, personal digital assistant (PDA), combination mobile telephone/PDA, data transmission device, one-way pager, two-way pager, and so forth.

The wireless device 100 may comprise a housing 102. The housing 102 may include one or more materials such as plastic, metal, ceramic, glass, and so forth, suitable for enclosing and protecting the internal components of the wireless device 100. The wireless device 100 may comprise various internal components such as, for example, a processor, a memory, one or more transceivers, one or more printed circuit board (PCBs), and so forth.

The wireless device 100 may comprise various input/output (I/O) devices such as a keyboard, keys, buttons, switches, a microphone, an audio headset, a camera, a touch-sensitive display screen, a stylus, and so forth. As shown in FIG. 1, for example, the wireless device 100 may comprise an alphanumeric keyboard 104 having a QWERTY key layout and an integrated number dial pad. The wireless device 100 may comprise various buttons such as, for example, a volume button 106, a customizable button 108, a left action button 110, a right action button 112, a phone/send button 114, a power/end button 116, a start button 118, an OK button 120, and a navigation button 122. The wireless device 100 may comprise an audio port 124 to connect an audio headset, a microphone 126, a ringer on/off switch 128 having a vibrate mode, and an expansion slot 130 to support a multimedia and/or memory card, for example.

The wireless device 100 may comprise a serial connection port 132, an infrared port 134, and/or integrated Bluetooth® wireless capability to enable wired (e.g., USB cable) and/or wireless connection to a local computer system, such as a local personal computer (PC). In various implementations, the wireless device 100 may be arranged to transfer and/or synchronize information with the local computer system. The wireless device 100 also may comprise a rechargeable battery, such as a removable and rechargeable lithium ion battery, and an AC adapter.

The wireless device 100 may comprise an antenna system including one or more antennas, such as an external antenna 136 implemented by a stub antenna, a whip antenna, an extendable antenna, and so forth. In various embodiments, the antenna system may comprise one or more internal antennas such as a planar inverted-F antenna, a planar inverted-L antenna, an inverted-F antenna with a helical structure, an inverted-L antenna with a helical structure, a monopole antenna, a meandered monopole antenna, a dipole antenna, a balanced antenna, a printed helical antenna, a chip antenna, a ceramic antenna, and so forth.

In various embodiments, the antenna system may be tuned for operating at one or more frequency bands such as the 824-894 Megahertz (MHz) frequency band for GSM operations, the 1850-1990 MHz frequency band for Personal Communications Services (PCS) operations, the 1575 MHz frequency band for Global Positioning System (GPS) operations, the 824-860 MHz frequency band for NAMPS operations, the 1710-2170 MHz frequency band for Wideband CDMA/Universal Mobile Telephone System (WCDMA/UMTS), ISM band in 2.4 GHz range for WiFi and Bluetooth, and other frequency bands. In various implementations, the antenna system may be used to implement spatial diversity techniques such as Evolution Data Optimized (EVDO) diversity at both 800 MHz (cellular) and 1900 MHz (PCS) bands.

The wireless device 100 may comprise a display 138. The display 138 may be implemented by a LCD or other type of suitable visual interface. The display 138 may comprise, for example, a touch-sensitive color (e.g., 16-bit color) display screen. In various implementations, the display 138 may comprise a thin-film transistor (TFT) LCD including embedded transistors. In such implementations, the display 138 may comprise a transistor for each pixel to implement an active matrix. While the embodiments are not limited in this context, an active matrix requires lower current to trigger pixel illumination and is more responsive to change than a passive matrix.

The display 138 may be arranged to display media source content received by the wireless device 100. In various embodiments, the display 138 may be arranged to display the media source content in one or more modes, such as in a panoramic mode, a wide mode, and/or an optimized mode. In such embodiments, the modes may be selected under user-control.

The media source content may comprise, for example, image information, video information, audio/visual (A/V) information, and/or graphics information from a media source. In various embodiments, the media source content may comprise data derived from or associated with one or more images, image files, image groups, pictures, digital photographs, videos, video clips, video files, video sequences, video feeds, video streams, movies, broadcast programming, web pages, user interfaces, graphics, windows, alerts, games, regions, objects, frames, slices, macroblocks, blocks, pixels, sub-pixels, signals, and so forth.

In various implementations, the media source content received and to be displayed may comprise pixels derived from or associated with one or more static or video images. The pixels may comprise, for example, red-green-blue (RGB) pixels and/or luminance-chrominance pixels (e.g., YUV, YCC) and may include real and/or integer values. The embodiments are not limited in this context.

The media source generally may comprise any source capable of delivering media source content to the wireless device 100. An example of a media source may include a source for static or video image information, such as from a computer to a display. The media source may include a server, such as a web server arranged to deliver web content. Another example of a media source may include a source for A/V information such as television signals. The media source may be arranged to deliver standard analog television content, digital television content, HDTV content, and so forth. The media source may provide broadcast or streaming analog or digital video content. The media source may include a device arranged to deliver pre-recorded media content stored in various formats, such as a DVD device, a Video Home System (VHS) device, a digital VHS device, a digital camera, video camera, a portable media player, a gaming device, and so forth.

In various embodiments, the wireless device 100 may be arranged to receive media source content through one or more wireless wide area network (WWAN) data communication services. Examples of cellular data communication systems offering WWAN data communication services may include a GSM with General Packet Radio Service (GPRS) systems (GSM/GPRS), CDMA/1xRTT systems, Enhanced Data Rates for Global Evolution (EDGE) systems, Evolution Data Only or EVDO systems, Evolution for Data and Voice (EV-DV) systems, High Speed Downlink Packet Access (HSDPA) systems, and so forth. The embodiments are not limited in this context.

In various embodiments, the media source content may comprise an aspect ratio and/or a resolution that differs from the aspect ratio and/or the resolution of the display 138. In one embodiment, for example, the media source content may have an aspect ratio of 3:2 with a resolution of 480×320, and the display may have an aspect ratio of 1:1 with a resolution of 320×320. In another embodiment, for example, the media source content may have an aspect ratio of 2:1 with a resolution of 640×320, and the display may have an aspect ratio of 3:2 with a resolution of 480×320. The embodiments are not limited in this context.

As shown, the display 138 may comprise a plurality of display regions, such as regions **140-1-*n*, where n represents a positive integer value. In various embodiments, the plurality of display regions 140-1-*n* may be arranged to implement a panoramic display for a wireless device 100 having a square or substantially square display 138, such as a display having an aspect ratio of 1:1 with a resolution of 320×320, 480×480, and so forth. The embodiments, however, are not limited in this context. For example, in some embodiments, the display 138** may have an aspect ratio of 3:2 with a resolution of 480×320 or other aspect ratio and/or resolution.

In various embodiments, the media source content may have a different aspect ratio and/or a resolution than the display 138. In such embodiments, image compression and/or scaling may be applied to the media source content that is to be displayed in one or more of the display regions **140-1-*n*. The image compression and/or scaling may comprise visual scaling with a factor smaller than one in order to reduce size. In various implementations, the image compression and/or scaling may be applied progressively to the media source content based on the proximity of a display region to the edge of the display 138. For example, more image compression and/or scaling may be applied to the media source content that is to be displayed closer to edges of the display 138, than to the media source content that is to be displayed closer to the center of the display 138**.

In various embodiments, the image compression and/or scaling may be applied to the media source content using various physical or logical elements implemented as hardware, software, or any combination thereof, as desired for a given set of design parameters or performance constraints. In some embodiments, for example, the wireless device 100 may comprise display control hardware implemented by one or more processors, controllers, encoder devices, decoder devices, coder/decoder (CODEC) devices, scaling devices, filters, converters, circuits, chips, logic devices, logic gates, switches, registers, semiconductor devices, transistors, or combination thereof.

In some embodiments, for example, the wireless device 100 may comprise display control software implemented by one or more applications, drivers, programs, modules, subroutines, instruction sets, instructions, computing codes, or combination thereof. The display control software may be implemented according to a predefined computer language for instructing a processor to perform a certain function. Examples of a computer language may include C, C++, Java, BASIC, Perl, Matlab, Pascal, Visual BASIC, assembly language, machine code, micro-code, and so forth.

In various implementations, the wireless device 100 may be arranged to process a line of source pixels to generate a compressed and/or scaled line of display pixels. The wireless device 100 may comprise, for example, various physical or logical elements arranged to process media source pixels and to generate display pixels by performing processing operations such as adding, subtracting, multiplying, dividing, sampling, compressing, converting, filtering, scaling, interpolating, and so forth.

In various embodiments, the wireless device 100 may be arranged to perform image compression and/or scaling using one or more sample-rate converters implemented by hardware and/or software. In some embodiments, for example, the wireless device 100 may comprise sample-rate converters implemented in hardware by programmable polyphase filters arranged to sample a line of source pixels and to generate a compressed and/or scaled line of display pixels based on a compression factor. When implemented in hardware, the polyphase filters typically may comprise 3 to 7 taps per filter. In some embodiments, for example, the wireless device 100 may comprise sample-rate conversion software to perform sample-rate conversion, such as polyphase filtering. In some implementations, the polyphase filtering may be optimized for multimedia extensions (MMX). The embodiments are not limited in this context.

In various implementations, the plurality of display regions 140-*n* may extend horizontally between the edges of the display 138, and each one of the display regions 140-1-*n* may comprise or be defined by a number of pixels in a horizontal direction. Although not limited in this context, the number of display regions 140-1-*n* may comprise an odd number greater than or equal to five (e.g., n=5, 7, 9, . . . ).

In one embodiment, for example, the plurality of display regions 140-1-*n* may comprise five display regions (e.g., n=5). In this embodiment, the plurality of display regions 140-1-5 may comprise a central display region 140-3, lateral display regions 140-1 and 140-2 to the left of the central display region 140-3, and lateral display regions 140-4 and 140-5 to the right of the central display region 140-3. Each of the plurality of display regions 140-1-5 may comprise or be defined by a number of pixels in a horizontal direction. The total number of pixels defining the display regions 140-1-5 may correspond to the horizontal resolution of the display 138.

Table 1 illustrates an implementation for one embodiment of a display 138 comprising display regions 140-1-5.

TABLE 1

| | Region | | | | | |
|---|---|---|---|---|---|---|
| | 1 | 2 | 3 | 4 | 5 | Total |
| Pixels/Region | 10 | 50 | 200 | 50 | 10 | 320 |
| Compression Ratio | 4:1 | 2:1 | none | 2:1 | 4:1 | |
| Source Pixels | 40 | 100 | 200 | 100 | 40 | 480 |

In this implementation, the display 138 may have an aspect ratio of 1:1 with a resolution of 320×320, and the media source content to be displayed may have an aspect ratio of 3:2 with a resolution of 480×320. The display regions 140-1-5 may be defined by the 320 horizontal pixels of the display 138. Because the media source content has a different aspect ratio and/or resolution than the display 138, image compression and/or scaling may be applied to the media source that is to be displayed in one or more of the display regions 140-1-5. In this embodiment, for example, image compression and/or scaling may be applied to the media source content that is to be displayed in the lateral display regions 140-1 and 140-2 and the lateral display regions 140-4 and 140-5. The image compression and/or scaling may be applied progressively. For example, more image compression and/or scaling may be applied to the media source content for the lateral display regions 140-1 and 140-5, which are closer to edges of the display 138, than to the media source content for the lateral regions 140-2 and 140-4.

In some embodiments, the lateral display regions 140-1 and 140-2 to the left of the central region 140-3 may be symmetric with the lateral display regions 140-5 and 140-4 to the right of the central display region 140-3. For example, the number of pixels and/or image compression ratio for each the lateral display regions 140-1 and 140-2 to the left of the central region 140-3 may be symmetric with the number of pixels and/or image compression ratio for each of the lateral display regions 140-5 and 140-4 to the right of the central display region 140-3. In such embodiments, image compression and/or scaling may be applied symmetrically for the lateral display regions 140-1 and 140-5 and for the lateral display regions 140-2 and 140-4.

As shown in Table 1, for example, the central display region 140-3 may comprise 200 pixels and require the media source content to undergo no image compression (e.g., 200 source pixels to 200 display pixels). The lateral display regions 140-1 and 140-5 each may comprise 10 pixels and subject media source content to a 4:1 image compression ratio (e.g., 40 source pixels to 10 display pixels). The lateral display regions 140-2 and 140-4 each may comprise 50 pixels and subject media source content to a 2:1 image compression ratio (e.g., 100 source pixels to 50 display pixels).

The embodiment illustrated by Table 1 may comprise, for example, sample-rate converter circuitry implemented by two symmetrically arranged programmable hardware-based sample-rate converters. One of the hardware-based sample-rate converters may be arranged to generate display pixels for lateral display regions 140-1 and 140-5 based on a 4:1 compression ratio. The other hardware-based sample-rate converter may be arranged to generate display pixels for lateral display regions 140-2 and 140-4 based on a 2:1 compression ratio. The embodiments, however, are not limited in this context. For example, the embodiment illustrated by Table 1 may comprise software to perform sample-rate conversion.

Figure 2:
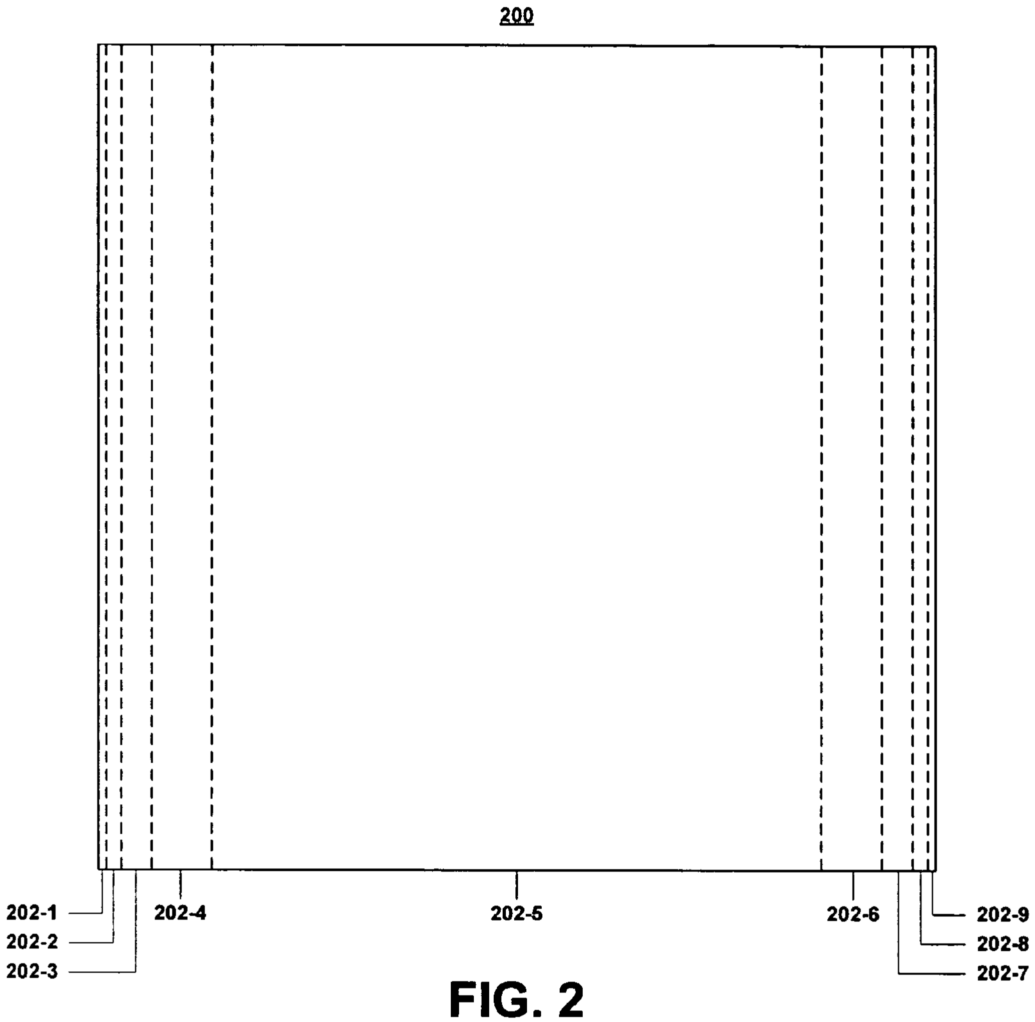
FIG. 2 illustrates one embodiment of a panoramic display.

FIG. 2 illustrates one embodiment of a panoramic display 200. In various embodiments, the panoramic display 200 may comprise, or be implemented by, the wireless device 100 of FIG. 1. The embodiments, however, are not limited in this context.

As shown, the panoramic display 200 may comprise a plurality of display regions 202-1-9 including a central display region 202-1-5, lateral display regions 202-1-4 to the left of the central display region 202-5, and lateral display regions 202-6-9 to the right of the central display region 202-5. Each of the plurality of display regions 202-1-9 may comprise or be defined by a number of pixels in a horizontal direction. In various implementations, the total number of pixels defining the display regions 202-1-9 may correspond to the horizontal resolution of the panoramic display 200. For example, the display regions 202-1-9 may be defined by the 320 horizontal pixels of a panoramic display 200 having an aspect ratio of 1:1 with a resolution of 320×320.

Figure 3:
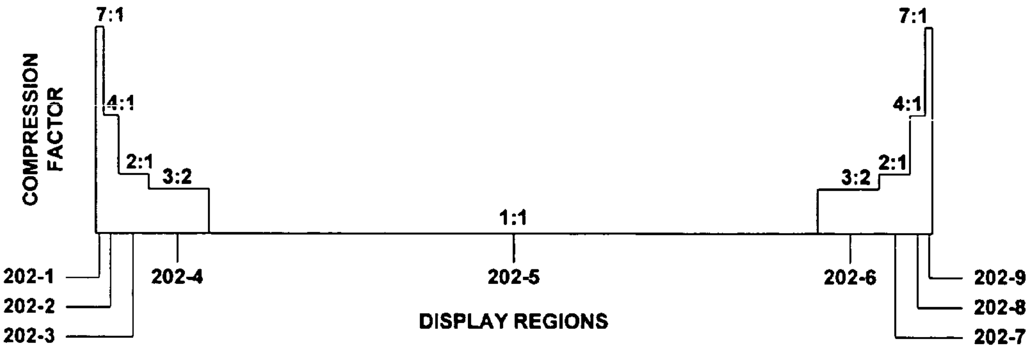
FIG. 3 illustrates one embodiment of compression factors.

FIG. 3 illustrates one embodiment of compression factors for a plurality of display regions. In various embodiments, the compression factors may be implemented by the display regions 202-1-9 of the panoramic display 200 of FIG. 2. The embodiments are not limited in this context.

As shown, the image compression and/or scaling may be applied progressively, and the image compression ratios for each of the lateral display regions 202-1-4 to the left of the central region 202-5 may be symmetric with the image compression rations for each of the lateral display regions 202-9-6 to the right of the central display region 202-5. In this embodiment, the image compression and/or scaling may be applied by four symmetrically arranged programmable hardware-based sample-rate converters. The first hardware-based sample-rate converter may be arranged to generate display pixels for lateral display regions 202-1 and 202-9 based on a 7:1 compression ratio. The second hardware-based sample-rate converter may be arranged to generate display pixels for lateral display regions 202-2 and 202-8 based on a 4:1 compression ratio. The third hardware-based sample-rate converter may be arranged to generate display pixels for lateral display regions 202-3 and 202-7 based on a 2:1 compression ratio. The fourth hardware-based sample-rate converter may be arranged to generate display pixels for display regions 204-1 and 206-9 based on a 3:2 compression ratio. The embodiments, however, are not limited in this context. For example, the embodiments may comprise software to perform sample-rate conversion.

In various embodiments, the panoramic display 200 may be implemented as either low compression or high compression based on the number of pixels and/or image compression ratio used for the plurality of display regions 202-1-9.

Table 2 illustrates a low compression implementation for a panoramic display 200 comprising display regions 202-1-9.

TABLE 2

| | Region | | | | | | | | | |
|---|---|---|---|---|---|---|---|---|---|---|
| | 1 | 2 | 3 | 4 | 5 | 6 | 7 | 8 | 9 | Total |
| Pixels/Region | 4 | 8 | 16 | 32 | 200 | 32 | 16 | 8 | 4 | 320 |
| Compression Ratio | 7:1 | 4:1 | 2:1 | 3:2 | none | 3:2 | 2:1 | 4:1 | 7:1 | |
| Source Pixels | 28 | 32 | 32 | 48 | 200 | 48 | 32 | 32 | 28 | 480 |

In this low compression implementation, the panoramic display 200 may have an aspect ratio of 1:1 with a resolution of 320×320, and the media source content may have an aspect ratio of 3:2 with a resolution of 480×320. The lateral display regions 202-1 and 202-9 each may comprise 4 pixels and subject the media source content to a 7:1 image compression ratio (e.g., 28 source pixels to 4 display pixels). The lateral display regions 202-2 and 202-8 each may comprise 8 pixels and subject the media source content to a 4:1 image compression ratio (e.g., 32 source pixels to 8 display pixels). The lateral display regions 202-3 and 202-7 each may comprise 16 pixels and subject the media source content to a 2:1 image compression ratio (e.g., 32 source pixels to 16 display pixels). The lateral display regions 202-4 and 202-6 each may comprise 32 pixels and subject the media source content to a 3:2 image compression ratio (e.g., 48 source pixels to 32 display pixels). The central display region 202-5 may comprise 200 pixels and require the media source content to undergo no image compression (e.g., 200 media source pixels to 200 display pixels).

Table 3 illustrates a high compression implementation for a panoramic display 200 comprising display regions 202-1-9.

TABLE 3

| | Region | | | | | | | | | |
|---|---|---|---|---|---|---|---|---|---|---|
| | 1 | 2 | 3 | 4 | 5 | 6 | 7 | 8 | 9 | Total |
| Pixels/Region | 2 | 4 | 8 | 16 | 260 | 16 | 8 | 4 | 2 | 320 |
| Compression Ratio | 14:1 | 8:1 | 4:1 | 3:1 | none | 3:1 | 4:1 | 8:1 | 14:1 | |
| Source Pixels | 28 | 32 | 32 | 48 | 260 | 48 | 32 | 32 | 28 | 480 |

In this high compression implementation, the panoramic display 200 may have an aspect ratio of 1:1 with a resolution of 320×320, and the media source content may have an aspect ratio of 3:2 with a resolution of 480×320. The lateral display regions 202-1 and 202-9 each may comprise 2 pixels and subject the media source content to a 14:1 image compression ratio (e.g., 28 source pixels to 2 display pixels). The lateral display regions 202-2 and 202-8 each may comprise 4 pixels and subject the media source content to an 8:1 image compression ratio (e.g., 32 source pixels to 4 display pixels). The lateral display regions 202-3 and 202-7 each may comprise 8 pixels and subject the media source content to a 4:1 image compression ratio (e.g., 32 source pixels to 8 display pixels). The lateral display regions 202-4 and 202-6 each may comprise 16 pixels and subject the media source content to a 3:1 image compression ratio (e.g., 48 source pixels to 16 display pixels). The central display region 202-5 may comprise 260 pixels and require the media source content to undergo no image compression (e.g., 260 media source pixels to 260 display pixels).

In various embodiments, the central display region 202-5 may comprise an expanded linear area. For example, in the high compression implementation illustrated by Table 3, each of the left lateral display regions 202-1-4 and the right lateral display regions 202-6-9 may be arranged to display 30 pixels (e.g., 2+4+8+16) by compressing and/or scaling 140 horizontal source pixels (e.g., 28+32+32+48). As shown in Table 3, the high compression may allow the central display region 202-5 of a display with a resolution of 320×320 to be expanded laterally in one or both directions to display 260 media source pixels which are not subjected to image compression and/or scaling. In some implementations, the central display region 202-5 may be reduced to create an expanded non-linear area. In general, however, it may be desirable to configure the central display region 202-5 to be as large as possible.

In the embodiments illustrated by Table 3, the lateral display regions 202-1-4 to the left of the central region 202-5 may be symmetric with the lateral display regions 202-9-6 to the right of the central display region 202-5. In such embodiments, image compression and/or scaling may be applied by four symmetrically arranged hardware-based sample-rate converters. The first hardware-based sample-rate converter may be arranged to generate display pixels for lateral display regions 202-1 and 202-9 based on a 14:1 compression ratio. The second hardware-based sample-rate converter may be arranged to generate display pixels for lateral display regions 202-2 and 202-8 based on an 8:1 compression ratio. The third hardware-based sample-rate converter may be arranged to generate display pixels for lateral display regions 202-3 and 202-7 based on a 4:1 compression ratio. The fourth hardware-based sample-rate converter may be arranged to generate display pixels for display regions 204-1 and 206-9 based on a 3:1 compression ratio. The embodiments, however, are not limited in this context. For example, the embodiments may comprise software to perform sample-rate conversion.

In various embodiments, image compression and/or scaling may be applied to the left lateral display regions 202-1-5 and the right lateral display regions 202-9-6 asymmetrically. In some embodiments, for example, the center of linearity and/or center of compression for the panoramic display 200 may be shifted to the left and/or to the right under user-control (e.g., navigation button 122) to provide a shifted or magnified effect. In one embodiment, for example, the panoramic display 200 may be shifted to the left such that the left lateral display regions 202-1-4 include fewer display pixels and subject the media source content to higher compression and/or scaling than the right lateral display regions 202-6-9. Similarly, the panoramic display 200 may be shifted to the right such that the right lateral display regions 202-6-9 include fewer display pixels and subject the media source content to higher compression and/or scaling and than the left lateral display regions 202-1-4.

Table 4 illustrates a left shifted implementation for a panoramic display 200 comprising display regions 202-1-9.

TABLE 4

| | Region | | | | | | | | | |
|---|---|---|---|---|---|---|---|---|---|---|
| | 1 | 2 | 3 | 4 | 5 | 6 | 7 | 8 | 9 | Total |
| Pixels/Region | 2 | 4 | 8 | 16 | 230 | 32 | 16 | 8 | 4 | 320 |
| Compression Ratio | 14:1 | 8:1 | 4:1 | 3:1 | none | 3:2 | 2:1 | 4:1 | 7:1 | |
| Source Pixels | 28 | 32 | 32 | 48 | 230 | 48 | 32 | 32 | 28 | 480 |

In this left shifted implementation, the panoramic display 200 may have an aspect ratio of 1:1 with a resolution of 320×320, and the media source content may have an aspect ratio of 3:2 with a resolution of 480×320. The lateral display region 202-1 may comprise 2 pixels and subject the media source content to a 14:1 image compression ratio (e.g., 28 source pixels to 2 display pixels). The lateral display region 202-2 may comprise 4 pixels and subject the media source content to an 8:1 image compression ratio (e.g., 32 source pixels to 4 display pixels). The lateral display region 202-3 may comprise 8 pixels and subject the media source content to a 4:1 image compression ratio (e.g., 32 source pixels to 8 display pixels). The lateral display region 202-4 may comprise 16 pixels and subject the media source content to a 3:1 image compression ratio (e.g., 48 source pixels to 16 display pixels).

The lateral display region 202-6 may comprise 32 pixels and subject the media source content to a 3:2 image compression ratio (e.g., 48 source pixels to 32 display pixels). The lateral display region 202-7 may comprise 16 pixels and subject the media source content to a 2:1 image compression ratio (e.g., 32 source pixels to 16 display pixels). The lateral display region 202-8 may comprise 8 pixels and subject the media source content to a 4:1 image compression ratio (e.g., 32 source pixels to 16 display pixels). The lateral display region 202-9 may comprise 4 pixels and subject the media source content to a 7:1 image compression ratio (e.g., 28 source pixels to 4 display pixels).

As shown in Table 4, the central display region 202-5 may comprise 230 pixels which undergo no image compression (e.g., 230 media source pixels to 230 display pixels). In this left shifted implementation, the left lateral display regions 202-1-4 may be arranged to display 30 pixels (e.g., 2+4+8+16) by compressing and/or scaling 140 horizontal source pixels (e.g., 28+32+32+48). The right lateral display regions 202-6-9 may be arranged to display 60 pixels (e.g., 32+16+8+4) by compressing and/or scaling 140 horizontal source pixels (e.g., 48+32+32+28). In this case, the higher compression and/or scaling may allow the central display region 202-5 of a display with a resolution of 320×320 to be expanded laterally in the direction of the shift to display additional media source pixels which are not subjected to image compression and/or scaling.

The embodiment illustrated by Table 4 may comprise, for example, sample-rate converter circuitry implemented by seven hardware-based sample-rate converters. One of the hardware-based sample-rate converters may be arranged to generate display pixels for both lateral display regions 202-3 and 202-8 based on a 4:1 compression ratio. The other six hardware-based sample-rate converters may be arranged to generate display pixels for corresponding lateral display regions 202-1, 202-2, 202-4, 202-7, 202-7 and 202-9. The embodiments, however, are not limited in this context. For example, the embodiment illustrated by Table 4 may comprise software to perform sample-rate conversion.

In some embodiments, image compression and/or scaling may be applied in a horizontal direction and/or in a vertical direction. When applied in both the horizontal and vertical direction, the image compression and/or scaling may allow expansion of the lateral display regions 202-1-4 and 202-6-9 to create a magnified effect or to simulate a video graphics array (VGA) having a resolution of 640×480 with a display having a resolution of 320×320.

Figure 4A:
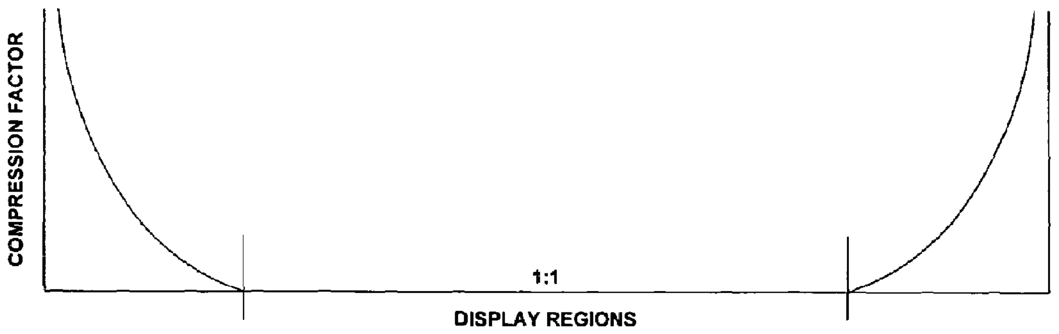
FIGS. 4A-C illustrate one embodiment of compression factors.
Figure 4B:
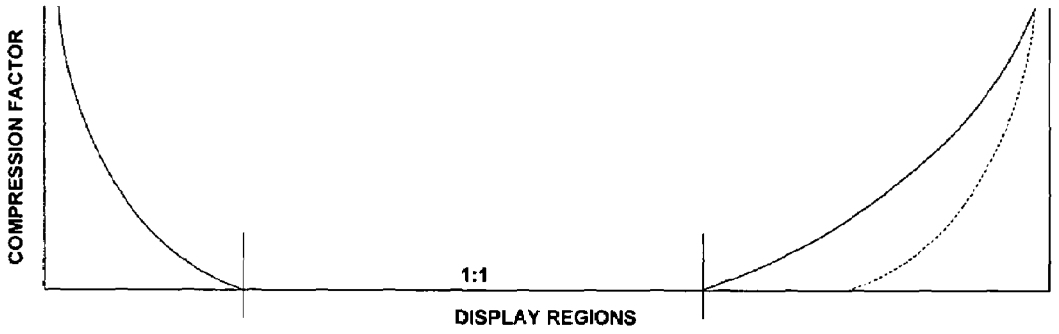
Figure 4C:
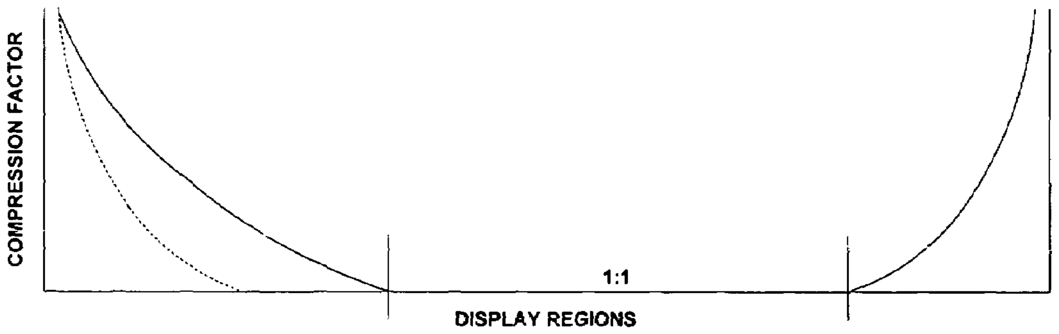

FIGS. 4A-C illustrate one embodiment of compression factors for a plurality of display regions. In various embodiments, the compression factors may be implemented by the wireless device 100 of FIG. 1 or by the panoramic display 200 of FIG. 2. The embodiments are not limited in this context.

As shown in FIG. 4A, the image compression and/or scaling may be applied progressively, and the image compression ratios for left lateral display regions may be symmetric with the image compression rations for right lateral display regions. As shown in FIG. 4B, the image compression and/or scaling may be shifted to the left such that left lateral display regions and subject media source content to higher compression and/or scaling than right lateral display regions. As shown in FIG. 4C, the image compression and/or scaling may be shifted to right such that right lateral display regions subject media source content to higher compression and/or scaling than left lateral display regions.

In this embodiment, a panoramic display may be implemented by employing significantly more display regions (e.g., >30) and hardware-based sample-rate converters to smooth the visual transitions from one display region to another. In some implementations, the panoramic display may employ software to perform the sample-rate conversion at the expense of more memory and processing power. When performed by software, the sample-rate conversion may be implemented in registers rather than random access memory (RAM) to minimize the number of accesses or taps and to reduce processing expense. The embodiments are not limited in this context.

Figure 5:
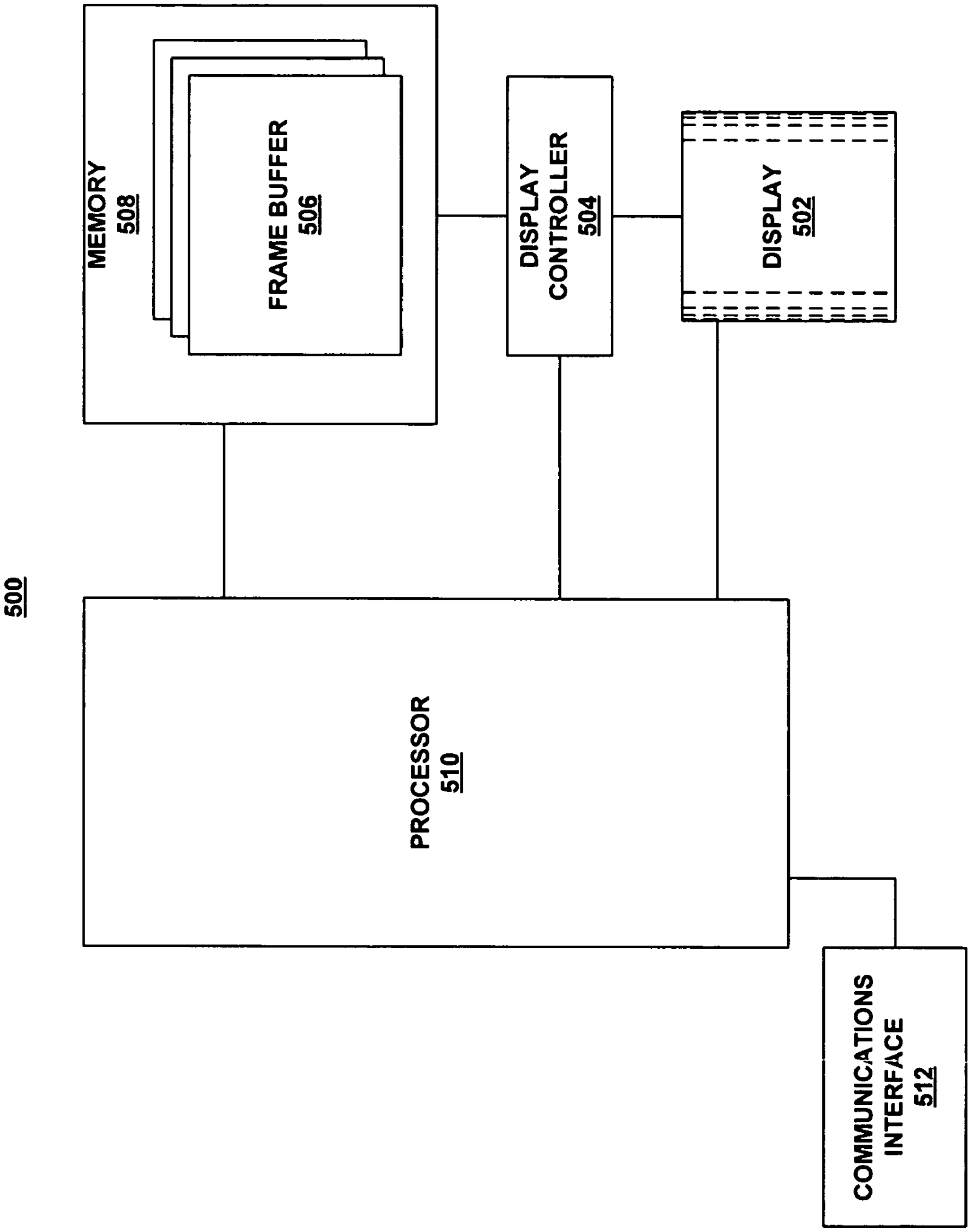
FIG. 5 illustrates one embodiment of a computing system.

FIG. 5 illustrates one embodiment of a computing system 500. In various embodiments, the computing system 500 may comprise or be implemented by the wireless device 100 of FIG. 1 or any other type of wireless device. The embodiments are not limited in this context.

The computing system 500 generally may comprise various physical or logical elements implemented as hardware, software, or any combination thereof, as desired for a given set of design parameters or performance constraints. In various embodiments, the physical or logical elements may be connected by one or more communications media. Communications media generally may comprise any medium capable of carrying information signals. For example, communication media may comprise wired communication media, wireless communication media, or a combination of both, as desired for a given implementation.

As shown, the computing system 500 may comprise a display 502. The display 502 may be implemented using any type of visual interface such as an LCD. As shown, the display 502 may comprise a plurality of display regions arranged to implement a panoramic display, as described above. In some embodiments, the display 510 may have an aspect ratio of 1:1 with a resolution of 320×320, 480×480, and so forth. In other embodiments, the display 502 may have an aspect ratio of 3:2 with a resolution of 480×320 or other aspect ratio and/or resolution. The embodiments are not limited in this context.

The computing system 500 may comprise a display controller 504. The display controller 504 may comprise, or be implemented as hardware, software, or any combination thereof. In some embodiments, for example, the display controller 504 may comprise one or more processors, controllers, encoder devices, decoder devices, CODEC devices, scaling devices, filters, converters, circuits, chips, logic devices, logic gates, switches, registers, semiconductor devices, transistors, or combination thereof. In some embodiments, for example, the display controller 504 may comprise software implemented by one or more applications, drivers, programs, modules, subroutines, instruction sets, instructions, computing codes, or combination thereof.

The display controller 504 may be arranged to performing various processing operations such as adding, subtracting, multiplying, dividing, sampling, compressing, converting, filtering, scaling, interpolating, and so forth. In various embodiments, the display controller 504 may comprise one or more sample-rate converters implemented by hardware and/or software. In some embodiments, for example, the display controller 504 may comprise sample-rate converters implemented in hardware by programmable polyphase filters arranged to sample a line of source pixels and to generate a compressed and/or scaled line of display pixels based on a compression factor. In some embodiments, for example, the display controller 504 may comprise sample-rate conversion software to perform sample-rate conversion, such as polyphase filtering (e.g., MMX optimized polyphase filtering). The embodiments are not limited in this context.

As shown, the computing system 500 may comprise a frame buffer 506. In various embodiments, the frame buffer 506 may be arranged to store media source content. The media source content may comprise pixels derived from or associated with one or more static or video images. In various implementations, the frame buffer 508 may comprise one or more overlay planes and comprise pixels such as RGB pixels, YUV pixels, and/or YCC pixels. The embodiments are not limited in this context.

In various embodiments, the frame buffer 506 may be arranged to store media source content having an aspect ratio and/or a resolution that differs from the aspect ratio and/or the resolution of the display 502. In one embodiment, for example, the frame buffer 506 may be arranged to store media source content having an aspect ratio of 3:2 with a resolution of 480×320 to be displayed by a display 502 having an aspect ratio of 1:1 with a resolution of 320×320. In another embodiment, for example, the frame buffer 506 may be arranged to store media source content having an aspect ratio of 2:1 with a resolution of 640×320 to be displayed by a display 502 having an aspect ratio of 3:2 with a resolution of 480×320. The embodiments are not limited in this context.

In various embodiments, the display controller 504 may be arranged to apply image compression and/or scaling to the media source content stored in the frame buffer 506. For example, the display controller 504 may be arranged to retrieve and process a line of source pixels from the display buffer 506 to generate a compressed and/or scaled line of display pixels. In some embodiments, the display controller 504 may be arranged to apply image compression and/or scaling in the horizontal direction and/or in the vertical direction.

In various implementations, the display controller 504 may be arranged to apply image compression and/or scaling progressively to the media source content based on the proximity of a display region to the edge of the display 502. For example, the display controller 504 may apply more image compression and/or scaling to the media source content that is to be displayed closer to edge of the display 502, than to the media source content that is to be displayed closer to the center of the display 502.

In some implementations, the display controller 504 may be arranged to apply image compression and/or scaling symmetrically to left and right lateral display regions. In some implementations, the display controller 504 may be arranged to apply more image compression and/or scaling to either the left or the right lateral display regions. In other implementations, the display controller 504 may be arranged to expand one or more display regions to create a magnified effect.

As shown, the frame buffer 506 may be implemented by a memory 508. In various embodiments, the memory 508 may comprise any machine-readable or computer-readable media capable of storing data, including both volatile and non-volatile memory. For example, memory may include read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

The computing system 500 may comprise a processor 510 such as a central processing unit (CPU). In various embodiments, the processor 510 may be implemented as a general purpose processor, a chip multiprocessor (CMP), a dedicated processor, an embedded processor, a digital signal processor (DSP), a network processor, a media processor, an input/output (I/O) processor, a media access control (MAC) processor, a radio baseband processor, a co-processor, a microprocessor such as a complex instruction set computer (CISC) microprocessor, a reduced instruction set computing (RISC) microprocessor, and/or a very long instruction word (VLIW) microprocessor, or other processing device. The processor 510 also may be implemented by a controller, a microcontroller, an application specific integrated circuit (ASIC), a field programmable gate array (FPGA), a programmable logic device (PLD), and so forth. In some embodiments, the display controller 504 may comprise software running on the processor 510.

In various embodiments, the processor 510 may be arranged to run an operating system (OS) and various mobile applications. Examples of an OS include, for example, a Microsoft® Windows OS, a Palm OS®, and any other proprietary or open source OS. Examples of mobile applications include, for example, a telephone application, a camera (e.g., digital camera, video camera) application, a browser application, a multimedia player application, a gaming application, a messaging application (e.g., e-mail, short message, multimedia), a viewer application, and so forth.

In various embodiments, the processor 510 may be arranged to receive information, such as media source content, through a communications interface 512. The communications interface 512 may comprises any suitable hardware, software, or combination of hardware and software that is capable of coupling the computing system 512 to one or more networks and/or network devices. The communications interface 512 may be arranged to operate with any suitable technique for controlling information signals using a desired set of communications protocols, services or operating procedures. The communications interface 512 may include the appropriate physical connectors to connect with a corresponding communications medium.

In various embodiments, the communications interface 512 may comprise one or more interfaces such as, for example, a wireless communications interface, a wired communications interface, a network interface, a transmit interface, a receive interface, a media interface, a system interface, a component interface, a switching interface, a chip interface, a controller, and so forth. When implemented by a wireless device or within wireless system, for example, the computing system 500 may include a wireless interface comprising one or more antennas, transmitters, receivers, transceivers, amplifiers, filters, control logic, and so forth.

In various implementations, the described embodiments may communicate over wireless shared media in accordance with a number of wireless protocols. Examples of wireless protocols may include various wireless local area network (WLAN) protocols, including the Institute of Electrical and Electronics Engineers (IEEE) 802.xx series of protocols, such as IEEE 802.11a/b/g/n, IEEE 802.16, IEEE 802.20, and so forth. Other examples of wireless protocols may include various wireless wide area network (WWAN) protocols, such as GSM cellular radiotelephone system protocols with GPRS, CDMA cellular radiotelephone communication systems with 1xRTT, EDGE systems, EV-DO systems, EV-DV systems, HSDPA systems, and so forth. Further examples of wireless protocols may include wireless personal area network (PAN) protocols, such as an Infrared protocol, a protocol from the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles, and so forth. Yet another example of wireless protocols may include near-field communication techniques and protocols, such as electro-magnetic induction (EMI) techniques. An example of EMI techniques may include passive or active radio-frequency identification (RFID) protocols and devices. Other suitable protocols may include Ultra Wide Band (UWB), Digital Office (DO), Digital Home, Trusted Platform Module (TPM), ZigBee, and so forth.

In various implementations, the described embodiments may comprise part of a cellular communication system. Examples of cellular communication systems may include CDMA cellular radiotelephone communication systems, GSM cellular radiotelephone systems, North American Digital Cellular (NADC) cellular radiotelephone systems, Time Division Multiple Access (TDMA) cellular radiotelephone systems, Extended-TDMA (E-TDMA) cellular radiotelephone systems, Narrowband Advanced Mobile Phone Service (NAMPS) cellular radiotelephone systems, third generation (3G) systems such as WCDMA, CDMA-2000, UMTS cellular radiotelephone systems compliant with the Third-Generation Partnership Project (3GPP), and so forth.

Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, and the like. The instructions may be implemented using any suitable high-level, low-level, object-oriented, visual, compiled and/or interpreted programming language, such as C, C++, Java, BASIC, Perl, Matlab, Pascal, Visual BASIC, assembly language, machine code, and so forth.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

The invention claimed is:

1. A wireless device, comprising:

a panoramic display having a first aspect ratio, said panoramic display comprising a plurality of display regions including a central display region and a plurality of lateral display regions, said wireless device to receive media source content having a second aspect ratio that differs from said first aspect ratio, said wireless device to compress said media source content to be displayed in one or more of said lateral display regions based on proximity of said one or more lateral display regions to an edge of said display.

2. The wireless device of claim 1, further comprising a frame buffer to store media content having said second aspect ratio.

3. The wireless device of claim 2, wherein said frame buffer comprises one or more overlay planes.

4. The wireless device of claim 1, further comprising a display controller to compress media content having said second aspect ratio.

5. The wireless device of claim 4, said display controller to apply image compression progressively for left lateral display regions and right lateral display regions.

6. The wireless device of claim 4, said display controller to apply image compression symmetrically for left lateral display regions and right lateral display regions.

7. The wireless device of claim 4, said display controller to apply image compression asymmetrically for left lateral display regions and right lateral display regions.

8. The wireless device of claim 4, said display controller to apply compression in at least one of a horizontal direction a vertical direction.

9. The wireless device of claim 4, said display controller to expand one or more of said display regions.

10. The wireless device of claim 4, said display controller to apply a compression ratio to a line of media source pixels to generate a compressed line of display pixels.

11. The wireless device of claim 4, said display controller comprising a plurality of hardware-based sample-rate converters.

12. The wireless device of claim 4, said display controller comprising a sample-rate converter software application.

13. A system for a wireless device, comprising:

a display controller to compress media source content stored by a wireless device, said wireless comprising a panoramic display having a first aspect ratio, said panoramic display comprising a plurality of display regions including a central display region and a plurality of lateral display regions, said media source content having a second aspect ratio that differs from said first aspect ratio, said display controller to compress media source content to be displayed in one or more of said lateral display regions based on proximity of said one or more lateral display regions to an edge of said display.

14. The system of claim 13, said display controller comprising a plurality of hardware-based sample-rate converters.

15. The system of claim 13, said display controller comprising a sample-rate converter software application.

16. The system of claim 13, further comprising a frame buffer to store media content having said second aspect ratio.

17. A method comprising:

retrieving media source content stored by a wireless device, said wireless comprising a panoramic display having a first aspect ratio, said panoramic display comprising a plurality of display regions including a central display region and a plurality of lateral display regions, said media source content having a second aspect ratio that differs from said first aspect ratio; and compressing media source content to be displayed in one or more of said lateral display regions based on proximity of said one or more lateral display regions to an edge of said display.

18. The method of claim 17, further comprising receiving said media source content at said wireless device.

19. The method of claim 17, further comprising displaying compressed media source content in one or more of said lateral display regions.

* * * * *